United States Patent
Ka

(10) Patent No.: US 6,275,430 B1
(45) Date of Patent: Aug. 14, 2001

(54) SEMICONDUCTOR MEMORY DEVICE HAVING GLOBAL BIT LINE PRECHARGE CIRCUITS

(75) Inventor: Soon-Taeg Ka, Ichon (KR)

(73) Assignee: Hyundai Electronics Industries Co., Ltd., Ichon-shi (KR)

( * ) Notice: Subject to any disclaimer, the term of this patent is extended or adjusted under 35 U.S.C. 154(b) by 0 days.

(21) Appl. No.: 09/604,685

(22) Filed: Jun. 27, 2000

(30) Foreign Application Priority Data

Jun. 30, 1999 (KR) .............................................. 1999-25892

(51) Int. Cl.$^7$ ...................................................... G11C 7/12
(52) U.S. Cl. ............... 365/203; 365/230.03; 365/189.05; 365/189.06; 365/189.11; 365/190; 365/51; 365/194
(58) Field of Search ..................................... 365/203, 190, 365/230.03, 195, 51, 189.11, 189.06, 194, 189.05

(56) References Cited

U.S. PATENT DOCUMENTS

| 5,404,338 | 4/1995 | Murai et al. | 365/233 |
| 5,517,462 | 5/1996 | Iwamoto et al. | 365/233 |
| 5,608,688 | * | 3/1997 | Park | 365/233.5 |
| 5,956,285 | 9/1999 | Watanabe et al. | 365/230.03 |
| 5,959,910 | 9/1999 | McClure | 365/201 |

FOREIGN PATENT DOCUMENTS

| 09120674 | 5/1997 | (JP) | G11C/11/409 |
| 09147560 | 6/1997 | (JP) | G11C/11/409 |
| 10199250 | 7/1998 | (JP) | G11C/11/409 |

* cited by examiner

*Primary Examiner*—Andrew Q. Tran
(74) *Attorney, Agent, or Firm*—Jacobson Holman, PLLC

(57) ABSTRACT

A semiconductor memory device includes: a global I/O line pair having a global I/O line and a complementary global I/O line; a data I/O buffer unit, coupled to the global I/O line pair; a plurality of banks, coupled to the global I/O line pair, for storing data, said banks including: a first bank coupled to the global I/O line pair; and a second bank coupled to the global I/O line pair, wherein the second bank is located closer to the data I/O buffer unit than the first bank is; a control signal generating unit for generating a control signal, said control signal has a first level and a second level in a read operation and a write operation, respectively; a first precharge unit located closely to said first bank, said first precharge unit sensing a level transition of the global I/O line pair and precharging the global I/O line pair in response to the control signal of the second level in a write operation; and a second precharge unit located closely to said second bank, said second precharge unit sensing a level transition of the global I/O line pair and precharging the global I/O line pair in response to an inverted signal of the control signal in the read operation.

14 Claims, 6 Drawing Sheets

SEMICONDUCTOR MEMORY DEVICE HAVING GLOBAL BIT LINE PRECHARGE CIRCUITS

FIELD OF THE INVENTION

The present invention relates to a semiconductor memory device; and, more particularly, to a semiconductor memory device having two or more precharge circuits, which is capable of providing a high speed of operation and a stable read/write operation.

DESCRIPTION OF THE PRIOR ART

A semiconductor memory device includes a dynamic random access memory (DRAM) and a synchronous dynamic random access memory (SDRAM), such as a single data rate (SDR) SDRAM and a double data rate (DDR) SDRAM.

In a read operation, a semiconductor memory device reads out data from a selected memory cell and transfers it via a global I/O (input/output) line pairs to an external circuit. In a write operation, the semiconductor memory device writes data to a selected memory cell via the global I/O line pairs. The global I/O line pair includes a global I/O line and a complementary, or inverted, global I/O line. The global I/O line pair transmit data signals, which are complementary to each other.

The semiconductor memory device has three operational modes in transmitting data via the global I/O line pair. In a standby mode, i.e., before starting the read or write operation, the global I/O line pair is in a state of a power supply voltage level. In a data transfer mode, one of the global I/O line pair, e.g., a global I/O line, becomes a low level when data is applied to the global I/O line pair. In a precharge mode, the global I/O line is precharged to the power supply voltage level in order to prepare a next read or write operation.

FIG. 1 is a block diagram showing a semiconductor memory device having a conventional precharge structure.

As shown in FIG. 1, a conventional semiconductor memory device includes a global I/O line pair having a global I/O line GIO and a complementary global I/O line /GIO, a plurality of banks 100 and 101 coupled to the global I/O line pair, a data I/O buffer 113 for inputting an input data from an external circuit and outputting an output data to the external circuit and a precharge circuit 112 for precharging the global I/O line pair to a power supply voltage level.

In a bank A 100 as one of the banks, a plurality of memory cell arrays 102 and 103 containing memory cells stores data. A write driver 106 receives data from the global I/O line pair via a local I/O line pair LIO and /LIO, to write the data to a selected memory cell. A sense amplifier 107 senses and outputs data stored in a selected memory cell. The other banks, e.g., a bank B 101, have the same structure as the bank A 100.

At this time, a data signal at the global I/O line is delayed due to a plurality of RC loads 110 and 111, which are composed of resistance components and capacitance components distributed on the global I/O line pair. The delay of the data signal is generally proportional to a length of the global I/O line pair.

As shown in FIG. 1, the bank A 100 is located far from the data I/O buffer 113 and the bank B 101 is located closely to the data I/O buffer 113. A reference symbol $N_A$ represents a node of the global I/O line pair to which the bank A 100 is coupled, and a reference symbol $N_B$ represents a node of the global I/O line pair to which the bank B 101 is coupled.

FIG. 2 is a circuit diagram showing a precharge circuit shown in FIG. 1.

Referring to FIG. 2, the precharge circuit 112 includes a pull-up driving portion 210 coupled to the global I/O line pair, a clamping portion 230 coupled to the global I/O line pair and a precharging portion 250.

In a transfer mode, for example, when a voltage level of a global I/O line GIO becomes low, the pull-up driving portion 210 pulls up a voltage level of the complementary global I/O line /GIO in response to the low voltage level of the global I/O line GIO. The pull-up driving portion 210 includes two PMOS transistors PM201 and PM202, coupled between a power supply voltage source (Vcc) and the global I/O line pair, respectively, each of whose gates is cross coupled to the global I/O line pair.

The clamping portion 230 maintains a voltage level of the global I/O line pair at a power supply voltage level before starting the read or write operation. The clamping portion 230 includes a PMOS transistor PM203 coupled between a power supply voltage level and the global I/O line GIO, whose gate is coupled to a ground, and a PMOS transistor PM204 coupled to the complementary global I/O line /GIO, whose gate is coupled to the ground.

The precharging portion 250 senses a level transition to the low voltage level of the global I/O line pair, and then precharges the global I/O line pair to the power supply voltage level after a predetermined time.

In the precharging portion 250, a precharge enable signal generating unit 255 detects a voltage difference between the global I/O line and the complementary global I/O line to generate a precharge enable signal GIO_PCG. A GIO precharge unit 256 precharges the global I/O line GIO in response to the precharge enable signal GIO_PCG, and a /GIO precharge unit 257 precharges the complementary I/O line /GIO in response to the precharge enable signal GIO_PCG.

The precharge enable signal generating unit 255 includes a NAND gate ND201 for NANDing the signal of the global I/O line GIO and the signal of the complementary global I/O line /GIO, an inverter INV201 for inverting an output of the NAND gate ND201 and a delay unit 253 for delaying an output of the inverter INV201 for a predetermined time. An output signal from the delay unit 253 corresponds to the precharge enable signal GIO_PCG.

The GIO precharge unit 256 is implemented with a PMOS transistor PM205 coupled between the power supply voltage source and the global I/O line GIO, whose gate receives the precharge enable signal GIO_PCG. The /GIO precharge portion 257 is also implemented with a PMOS transistor PM206 coupled between the power supply voltage source and the complementary global I/O line /GIO, whose gate receives the precharge enable signal GIO_PCG.

The PMOS transistors PM205 and PM206 are turned on in response to the precharge enable signal GIO_PCG of a low level, so that the global I/O line GIO and the complementary global I/O line /GIO are precharged to the power supply voltage level.

FIG. 3 is a timing chart showing a level transition of a global I/O line pair in a read operation with respect to the bank A shown in FIG. 1.

Referring to FIG. 3, in a read operation, one memory cell contained in a memory cell array of the bank A 100 is selected. The sense amplifier 107 senses and amplifies data stored in the selected memory cell to output an amplified data to the node $N_A$ of the global I/O line pair via the local I/O line pair. Then, the amplified data is transferred to the data I/O buffer 113 from the node $N_A$ through the node $N_B$. The data I/O buffer 113 outputs the amplified data to the external circuit.

As shown, when the data is transferred via the global I/O line pair, the precharge circuit 112 senses the level transition of the global I/O line pair to the low voltage level, and generates the precharge enable signal GIO_PCG after a predetermined time, thereby precharging the global I/O line pair to the power supply voltage level.

At this time, a waveform at the node $N_A$ has a steep precharge slope. However, a waveform at the node $N_B$ has a smooth precharge slope due to the RC loads 110 and 111 distributed on the global I/O line pair.

FIG. 4 is a timing chart showing a level transition of a global I/O line pair in a write operation with respect to the bank A shown in FIG. 1.

Referring to FIG. 4, in a write operation, the data I/O buffer 113 receives a data from an external circuit and transmits the data to the global I/O line pair. The data is transferred from the node $N_B$ to the node $N_A$, and then, the write driver 106 writes the data to a selected memory cell contained in a memory cell array of the bank A 100.

At this time, a waveform at the node $N_B$ has a steep precharge slope. However, a waveform at the node $N_A$ has a smooth precharge slope due to the RC loads 110 and 111 existing on the global I/O line pair.

In the read or write operation, although there is no problem in the banks located closely to the data I/O buffer, the level transition in the global I/O line pair is delayed in the banks located far from the data I/O buffer due to the RC loads. Therefore, a phenomenon of data overlap in a burst mode may occur due to a smooth precharge slope.

In order to solve the problem, the precharge circuit is located at the middle of the global I/O line pair. However, a precharge timing of the global I/O line pair is not equal according to positions of banks. Furthermore, in a high frequency operation, the nodes $N_A$ and $N_B$ may not be fully precharged to the power supply voltage level. As a result, the semiconductor memory device having a conventional precharge structure may not secure a high speed of operation, and a data failure may occur.

SUMMARY OF THE INVENTION

It is, therefore, an object of the present invention to provide a semiconductor memory device having two precharge circuit located at both ends of the global I/O line pair, capable of providing a high speed of operation and a stable read/write operation.

It is, therefore, an aspect of the present invention to provide a semiconductor memory device having a precharge structure, comprising: a global I/O line pair having a global I/O line and a complementary global I/O line; a data I/O buffer means, coupled to the global I/O line pair, for transmitting data inputted from an external circuit via the global I/O line pair and outputting data transmitted via the global I/O line pair to an external circuit; a plurality of banks, coupled to the global I/O line pair, for storing data, said banks including: a first bank coupled to the global I/O line pair; and a second bank coupled to the global I/O line pair, wherein the second bank is located closer to the data I/O buffer means than the first bank is; a control signal generating means for generating a control signal, said control signal has a first level and a second level in a read operation and a write operation, respectively; a first precharge means located closely to said first bank, said first precharge means sensing a level transition of the global I/O line pair and precharging the global I/O line pair in response to the control signal of the second level in a write operation; and a second precharge means located closely to said second bank, said second precharge means sensing a level transition of the global I/O line pair and precharging the global I/O line pair in response to an inverted signal of the control signal in the read operation.

BRIEF DESCRIPTION OF THE DRAWINGS

Other objects and aspects of the invention will become apparent from the following description of the embodiments with reference to the accompanying drawings, in which.

DETAILED DESCRIPTION OF THE PREFERRED EMBODIMENTS

Figure 5:
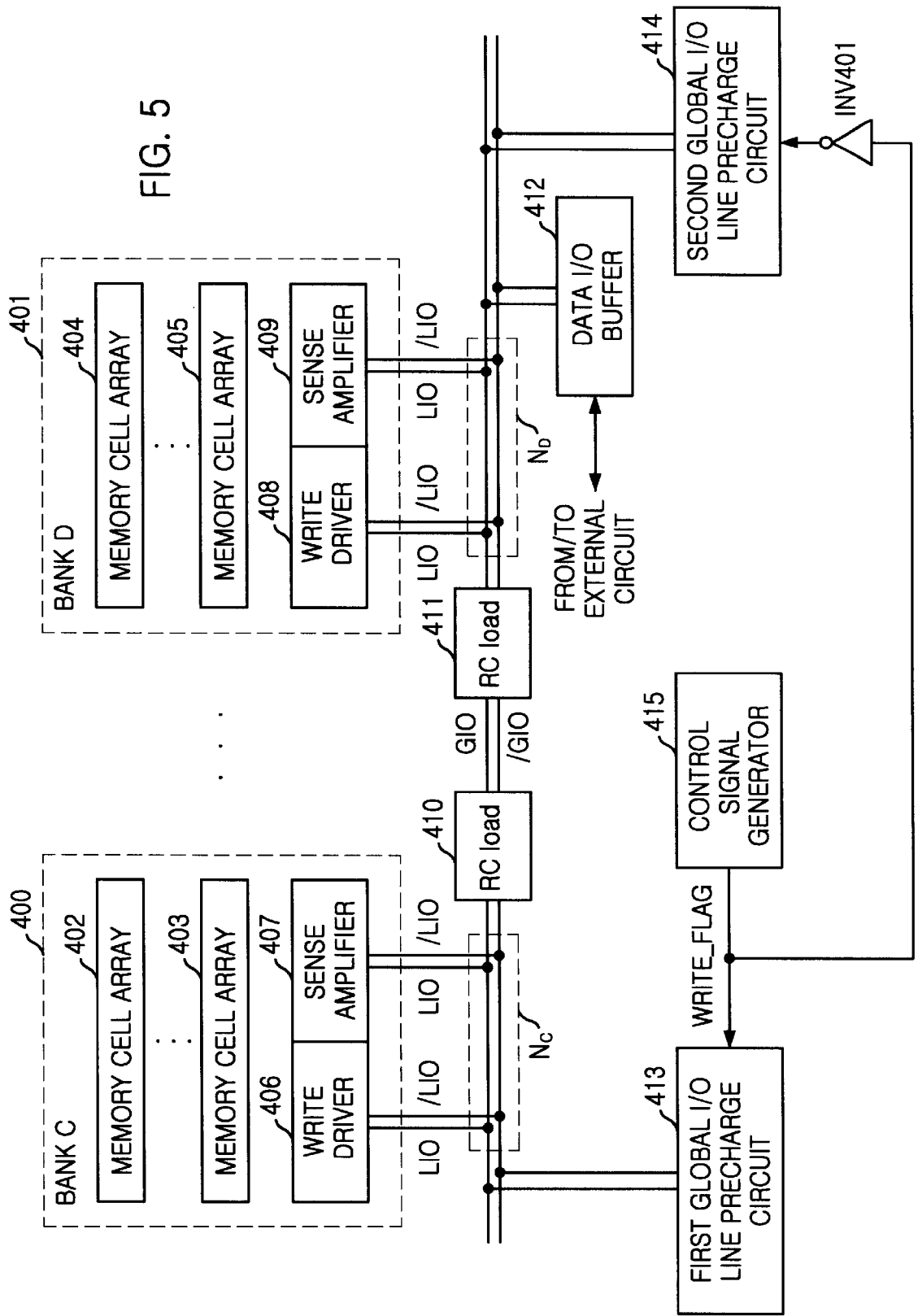
FIG. 5 is a block diagram illustrating a semiconductor memory device having a precharge structure in accordance with the present invention.

FIG. 5 is a block diagram illustrating a semiconductor memory device having a precharge structure in accordance with the present invention.

Referring to FIG. 5, a semiconductor memory device in accordance with the present invention includes a global I/O line pair having a global I/O line GIO and a complementary global I/O line /GIO, a plurality of banks 400 and 401 coupled to the global I/O line pair, a data I/O buffer 412 for inputting an input data from an external circuit and outputting an output data to the external circuit, a control signal generating circuit 415 for generating a control signal WRITE_FLAG, and a first and second precharge circuits 413 and 414, coupled to the global I/O line pair, for precharging the global I/O line pair in response to the control signal WRITE_FLAG in a read and write operation, respectively.

In the bank C 400 as one of the banks, a plurality of memory cell arrays 402 and 403 containing memory cells store data. A write driver 406 receives data of the global I/O line pair via a local I/O line pair and writes the data to a selected memory cell. A sense amplifier 407 senses and outputs data stored in a selected memory cell. The other banks, e.g., bank D 401, have the same structure as the bank C 400.

A plurality of RC loads 410 and 411 composed of resistance components and capacitance components are distributed on the global I/O line pair.

It should be noted that the bank C is located far from the data I/O buffer 412 and a bank D is located closely to the data I/O buffer 412. A reference symbol $N_C$ represents a node of the global I/O line pair to which the bank C 400 is coupled, and a reference symbol $N_D$ represents a node of the global I/O line pair to which the bank B 101 is coupled.

The first precharge circuit 413 is located closely to the bank C 400 and the second precharge circuit 414 is located closely to the bank D 401. That is, the first and second precharge circuits 413 and 414 are located at both ends of the global I/O line pair.

The control signal WRITE_FLAG from the control signal generator 415 is high in a write operation and is low in a read operation, respectively. That is, in the write operation, the first precharge circuit 413 is activated in response to the control signal WRITE_FLAG of a high level. On the contrary, the control signal WRITE_FLAG is inverted by an inverter INV401, and the second precharge circuit 414 is inactivated in response to an inverted control signal, i.e., the control signal WRITE_FLAG of a low level.

In the read operation, the control signal is low, and thus, the first precharge circuit 413 is inactivated in response to the control signal of a low level. On the contrary, the second precharge circuit 414 is activated in response to an inverted control signal from the inverter INV401, i.e., the control signal WRITE_FLAG of a high level.

Figure 6:
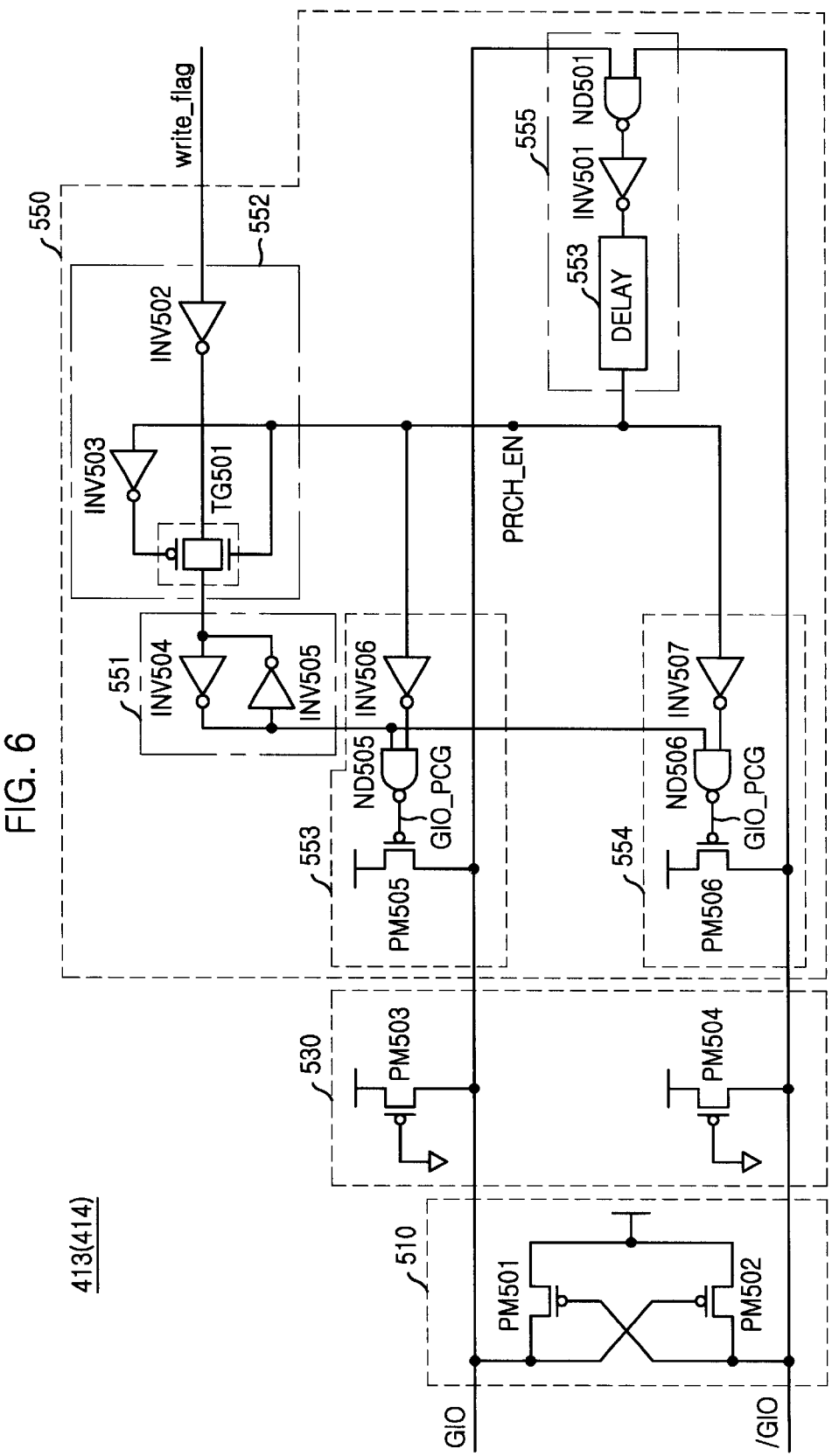
FIG. 6 is a circuit diagram illustrating a precharge circuit shown in FIG. 4.

FIG. 6 is a circuit diagram illustrating a precharge circuit shown in FIG. 5.

The first precharge circuit 413 includes a pull-up driving portion 510, a clamping portion 530 and a precharging portion 550.

When one, e.g., the global I/O line GIO, of the global I/O line pair becomes low, the pull-up driving portion 510 senses the low level of the global I/O line GIO and pulls up a voltage level of the complementary global I/O line /GIO.

The pull-up driving portion 510 is implemented with two PMOS transistors PM501 and PM502. The PMOS transistor PM501 has a source coupled to the power supply voltage level, a drain coupled to the global I/O line GIO, and a gate coupled to the complementary global I/O line /GIO. The PMOS transistor PM502 has a source coupled to the power supply voltage source, a drain coupled to the complementary global I/O line /GIO, and a gate coupled to the global I/O line GIO.

The clamping portion 530 maintains a voltage level of the global I/O line pair to the power supply voltage level in a standby mode, i.e., before starting a read or write operation.

The clamping portion 530 is implemented with two small-sized PMOS transistors PM503 and PM504. The PMOS transistor PM503 has a source coupled to the power supply voltage source, a drain coupled to the global I/O line GIO, and a gate coupled to a ground. The PMOS transistor PM504 has a source coupled to the power supply voltage source, a drain coupled to the complementary global I/O line /GIO and a gate coupled to the ground.

The precharging portion 550 senses a level transition to the low level of the global I/O line pair, and then precharges the global I/O line pair to the power supply voltage level after a predetermined time.

The precharging portion 550 also includes a precharge control signal generating unit 555 for generating a precharge control signal PRCH_EN, a signal transfer unit 552 for transferring the precharge control signal PRCH_EN in response to the control signal WRITE_FLAG, a latching unit 551 for latching and outputting the precharge control signal PRCH_EN, a GIO precharge unit 553 for precharging the global I/O line GIO in response to the precharge control signal PRCH_EN, and a /GIO precharge unit 554 for precharging the complementary global I/O line /GIO in response to the precharge enable signal PRCH_EN.

The precharge enable signal generating unit 555 includes a NAND gate ND501 for NANDing the signal of the global I/O line GIO and the signal of the complementary global I/O line /GIO, an inverter INV501 for inverting an output of the NAND gate ND501, and a delay unit 553 for delaying an output of the inverter INV501 for a predetermined time. An output signal from the delay unit 553 corresponds to the precharge enable signal PRCH_EN.

The signal transfer unit 552 includes an inverter INV502 for inverting the control signal WRITE_FLAG, a pass gate TG501 for transferring an inverted control signal in response to the precharge control signal PRCH_EN.

The latching unit 551 includes an inverter INV504 whose input terminal receiving an output signal from the pass gate TG504, and an inverter INV505 whose input terminal receiving an output signal from the inverter INV504 and whose output terminal coupled to the input terminal of the inverter INV504.

The GIO precharge unit 553 includes an inverter INV506 for inverting the precharge control signal PRCH_EN, a NAND gate ND505 for NANDing the output signal from the latching unit 551 and an output signal from the inverter INV506, and a PMOS transistor PM505 having a source coupled to the power supply voltage source, a drain coupled to the global I/O line GIO, and a gate receiving an output signal from the NAND gate ND505. The output signal from the NAND gate ND505 corresponds to a precharge enable signal GIO_PCG. The PMOS transistor PM505 is turned on in response to the precharge enable signal GIO_PCG of a low level, so that the global I/O line GIO is precharged.

A structure of the /GIO precharge unit 554 is the same as the GIO precharge unit 553, and therefore, a detailed description of the /GIO precharge unit 554 will be omitted for the sake of convenience in explanation.

Figure 7:
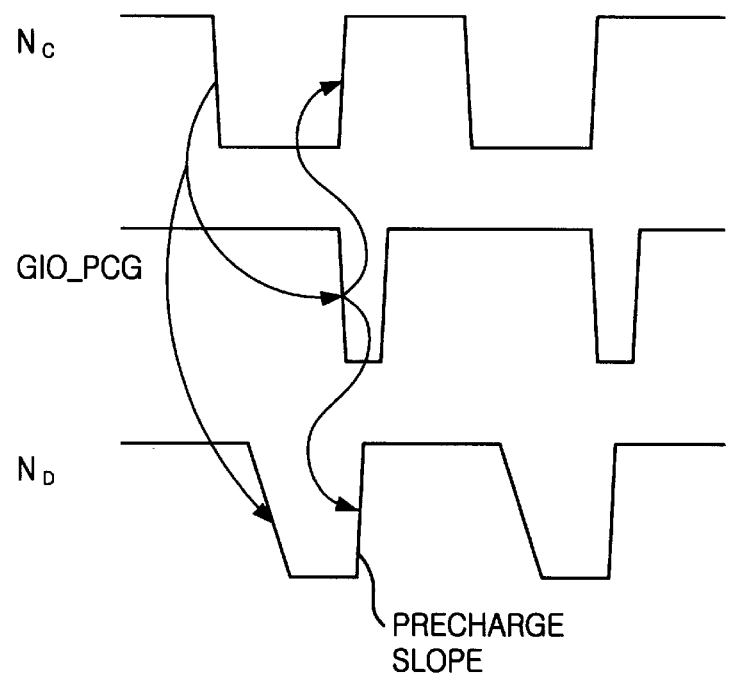
FIG. 7 is a timing chart illustrating a level transition of a global I/O line pair in a read operation with respect to a bank C shown in FIG. 5.
Figure 8:
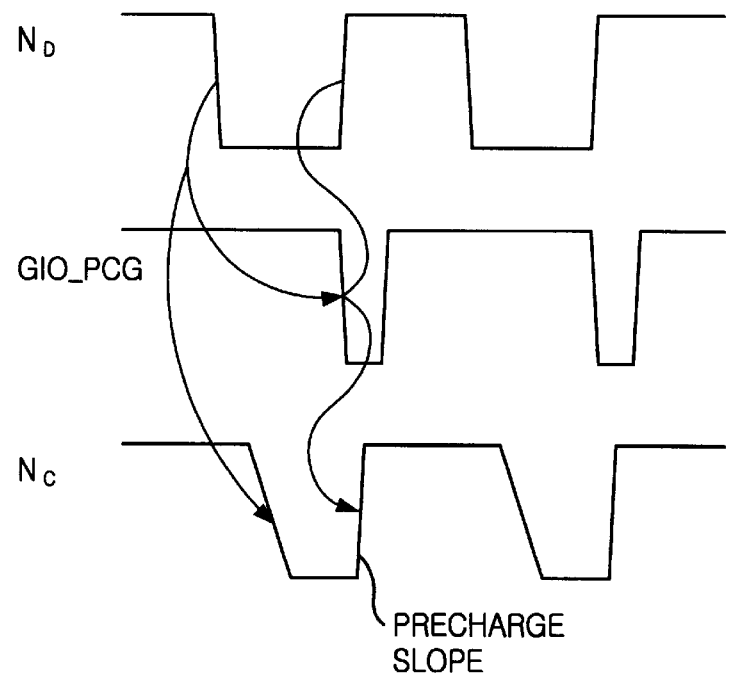
FIG. 8 is a timing chart illustrating a level transition of a global I/O line pair in a write operation with respect to a bank C shown in FIG. 5.

FIG. 7 is a timing chart showing a level transition of a global I/O line pair in a read operation with respect to the bank C, and FIG. 8 is a timing chart showing a level transition of a global I/O line pair in a write operation with respect to the bank C.

Hereinafter, an operation of the semiconductor memory device having the precharge structure in accordance with the present invention will be described in detail with reference to FIGS. 5 to 8.

It should be noted that the first precharge circuit 413 is located near the bank C 400 located far from the data I/O buffer 412, and the second precharge circuit 414 is located near the bank D 401 located closely to the data I/O buffer 412.

In the read mode, one memory cell contained in a memory cell array of the bank C 400 is selected and the sense amplifier 407 senses and amplifies the data to output an amplified data to the node $N_C$ of the global I/O line pair via the local I/O line pair. Then, the amplified data is transferred from the node $N_C$ through the node $N_D$. The data I/O buffer 113 outputs the amplified data to an external circuit.

At this time, the control signal WRITE_FLAG is disabled to a low level, so that the first precharge circuit 413 is inactivated in response to the control signal WRITE_FLAG of a low level.

On the contrary, the low level control signal WRITE_FLAG is inverted by an inverter INV401. Therefore, the second precharge circuit 414 is activated in response to an inverted control signal, i.e., the control signal WRITE_FLAG of a high level. The second precharge circuit 414 senses a level transition at the node $N_D$, and precharges the global I/O line pair to the power supply voltage level for a predetermined time.

Figure 1:
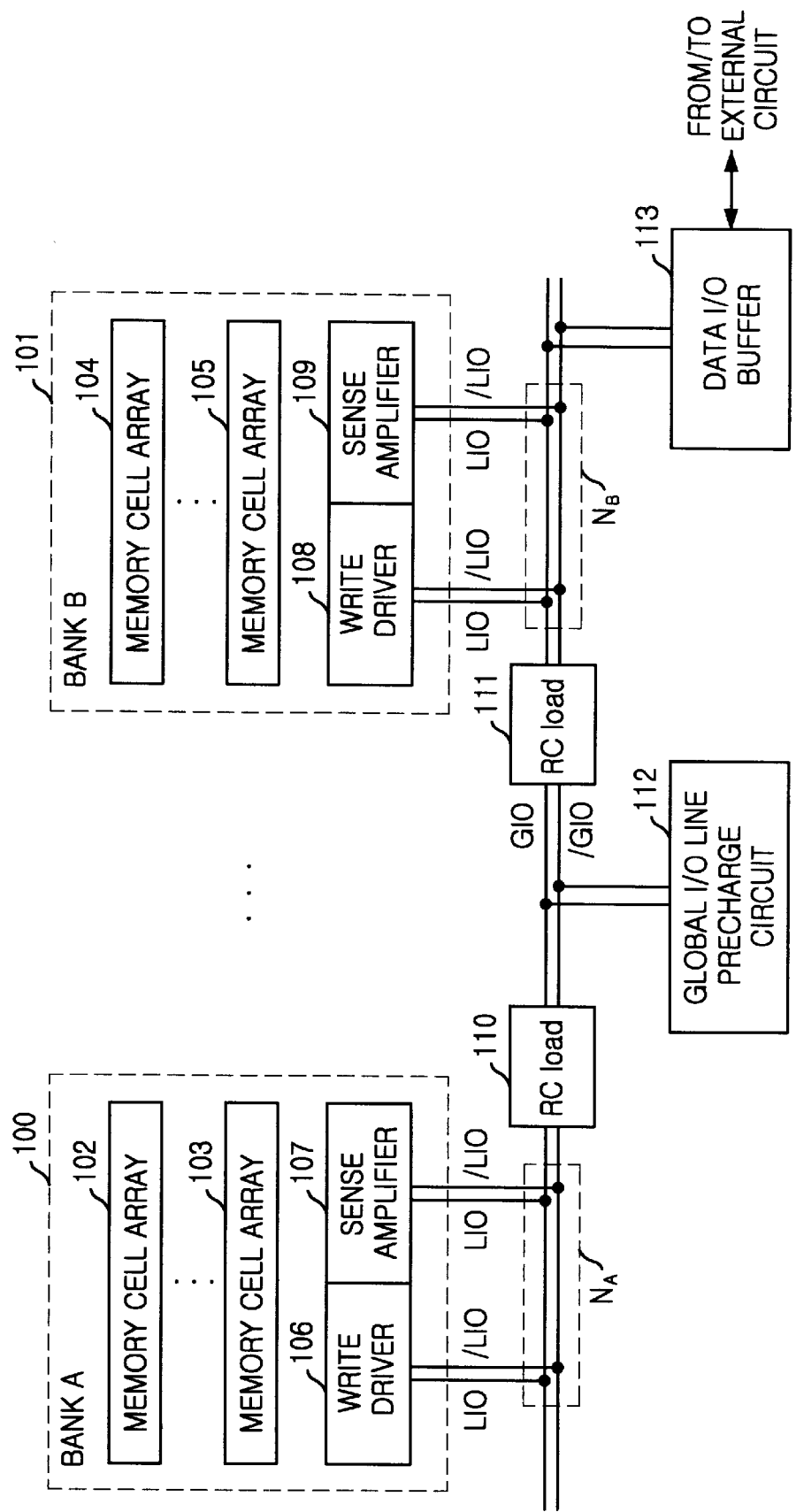
FIG. 1 is a block diagram showing a semiconductor memory device having a conventional precharge structure.
Figure 2:
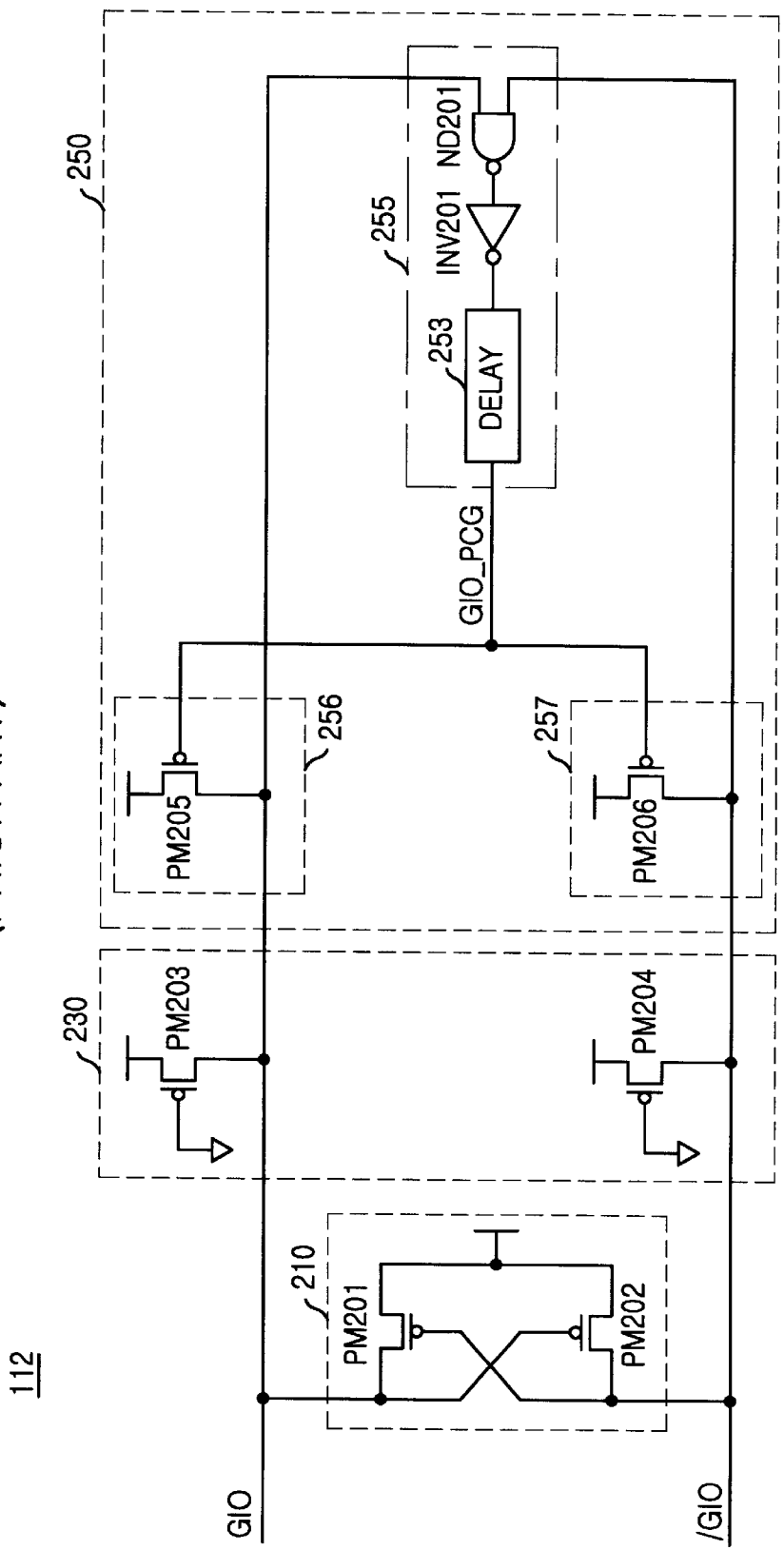
FIG. 2 is a circuit diagram showing a conventional precharge circuit shown in FIG. 1.
Figure 3:
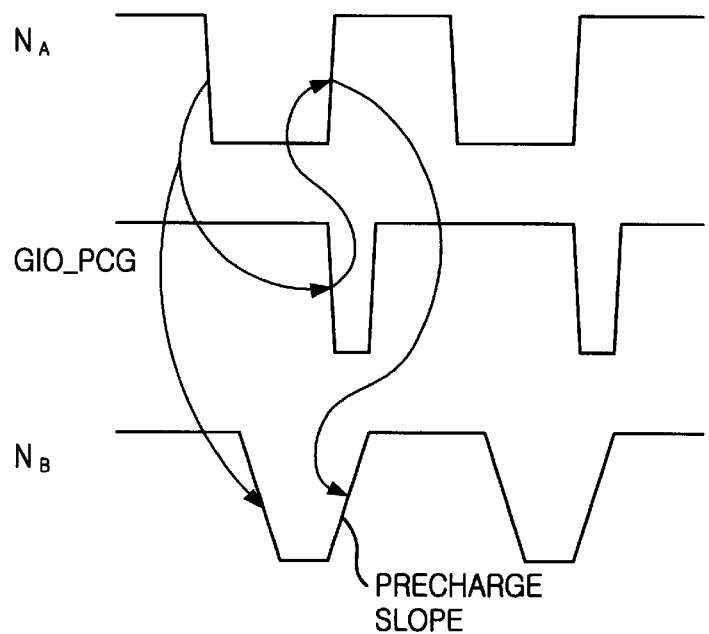
FIG. 3 is a timing chart showing a level transition of a global I/O line pair in a read operation with respect to the bank A shown in FIG. 1.

Compared with the waveform in FIG. 3, a waveform at the node $N_D$ has a steep precharge slope without a delay due to the RC loads 410 and 411.

In a write operation, the data I/O buffer 113 transmits a data to the global I/O line pair. The data is transferred from the node $N_D$ to the node $N_C$. Then, the write driver 406 writes the data to a selected memory cell contained in a memory cell array of the bank C 400.

At this time, the control signal WRITE_FLAG is enabled to a high level, so that second precharge circuit 414 is inactivated in response to the control signal WRITE_FLAG of a low level.

On the contrary, the first precharge circuit is activated in response to the control signal WRITE_FLAG of a high level. The first precharge circuit 413 senses a level transition of the global I/O line pair and precharges the global I/O line pair to the power supply voltage level after a predetermined time.

Figure 4:
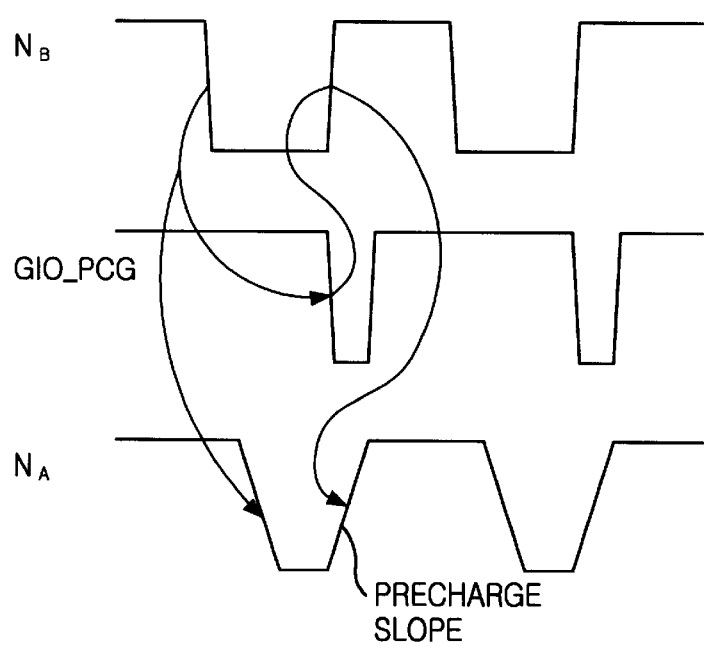
FIG. 4 is a timing chart showing a level transition of a global I/O line pair in a write operation with respect to the bank A shown in FIG. 1.

Compared with the waveform in FIG. 4, a waveform at the node $N_C$ has a steep precharge slope without a delay due to the RC loads 410 and 411 existing on the global I/O line pair.

Compared with the prior art, the semiconductor memory device according to the present invention has two precharge circuits located at both ends of the global I/O line pair. The two precharge circuits operate selectively according to the read and write operation. Therefore, in the read/write operation of the banks located far from the data I/O buffer, a waveform having the steep precharge slope in the data transmission is obtained, thereby securing a high speed of operation and a fast data access, and preventing the data failure. Preferably, the present invention is applicable to a DRAM, a SDR SDRAM and a DDR SDRAM.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A semiconductor memory device having a precharge structure, comprising:
    a global I/O line pair having a global I/O line and a complementary global I/O line;
    a data I/O buffer means, coupled to the global I/O line pair, for transmitting data inputted from an external circuit via the global I/O line pair and for outputting data transmitted via the global I/O line pair to the external circuit;
    a plurality of banks, coupled to the global I/O line pair, for storing data, said banks including:
        a first bank coupled to the global I/O line pair; and
        a second bank coupled to the global I/O line pair, wherein the second bank is located closer to the data I/O buffer means than the first bank is;
    a control signal generating means for generating a control signal, said control signal has a first level and a second level in a read operation and a write operation, respectively;
    a first precharge means located closely to said first bank, said first precharge means sensing a level transition of the global I/O line pair, to precharge the global I/O line pair in response to the control signal of the second level in the write operation; and
    a second precharge means located closely to said second bank, said second precharge means sensing a level transition of the global I/O line pair and precharging the global I/O line pair in response to an inverted signal of the control signal in the read operation.

2. The semiconductor memory device as recited in claim 1, wherein said first bank is located farthest away from said data I/O buffer means.

3. The semiconductor memory device as recited in claim 2, wherein said second bank is located closest from said data I/O buffer means.

4. The semiconductor memory device as recited in claim 1, wherein the first level is low and the second level is high.

5. The semiconductor memory device as recited in claim 1, wherein each of the plurality of said banks includes:
    a plurality of memory cell arrays, each having a plurality of memory cells for storing data;
    a write driving means for receiving data of said global I/O line pair via a local I/O line pair and writing the data to a selected memory cell; and
    a sensing and amplifying means for sensing and amplifying data from a selected memory cell and outputting an amplified data to the global I/O line pair via the local I/O line pair.

6. The semiconductor memory device as recited in claim 1, wherein the first precharge means includes:
    a pull-up driving means for sensing a level transition of one of the global I/O line pair to pull up a voltage level of the other of the global I/O line pair;
    a clamping means for maintaining a voltage level of the global I/O line pair at a power supply voltage level before starting the read and write operation; and
    a precharging means for sensing the level transition of the global I/O line pair, to precharge the global I/O line pair to the power supply voltage level after a predetermined time.

7. The semiconductor memory device as recited in claim 6, wherein said pull-up driving means includes:
    a first PMOS transistor having a source coupled to the power supply voltage source, a drain coupled to the global I/O line, and a gate coupled to the complementary global I/O line; and
    a second PMOS transistor having a source coupled to the power supply voltage source, a drain coupled to the complementary global I/O line, and a gate coupled to the global I/O line.

8. The semiconductor memory device as recited in claim 6, wherein said clamping means includes:
    a first PMOS transistor coupled between the power supply voltage source and the global I/O line, whose gate is coupled to a ground voltage; and
    a second PMOS transistor coupled between the power supply voltage source and the complementary global I/O line, whose gate is coupled to the ground voltage.

9. The semiconductor memory device as recited in claim 6, wherein said precharging means includes:
    a precharge control signal generating means for receiving a signal of the global I/O line and a signal of the complementary global I/O line to generate a precharge control signal;

a signal transfer means for transferring the control signal from the control signal generating means to an exterior in response to the precharge control signal;

a latching means for latching and outputting the control signal;

a global I/O line precharging means for precharging the global I/O line in response to the precharge control signal; and a complementary global I/O line precharging means for precharging the complementary global I/O line in response to the precharge control signal.

10. The semiconductor memory device as recited in claim 9, wherein said precharge control signal generating means includes:

a NAND gate for NANDing the signal of the global I/O line and the signal of the complementary global I/O line;

an inverter for inverting an output signal from the NAND gate; and a delay unit for delaying an output signal from the inverter.

11. The semiconductor memory device as recited in claim 9, wherein said signal transfer means includes:

an inverter for inverting the control signal from said control signal generating means; and a pass gate for transferring an output signal from said inverter in response to the precharge control signal.

12. The semiconductor memory device as recited in claim 9, wherein said latching means includes:

a first inverter, whose input terminal receives an output signal from said signal transfer means; and a second inverter, whose input terminal receives an output signal from said first inverter and whose output terminal is coupled to the input terminal of said first inverter.

13. The semiconductor memory device as recited in claim 9, wherein said global I/O line precharging means includes:

an inverter for inverting the precharge control signal;

a NAND gate for NANDing an output signal from said inverter and an output signal from said latching means; and a PMOS transistor having a source coupled to the power supply voltage source, a drain coupled to the global I/O line, and a gate receiving an output signal from said NAND gate.

14. The semiconductor memory device as recited in claim 9, wherein said complementary global I/O line precharging means includes:

an inverter for inverting the precharge control signal;

a NAND gate for NANDing an output signal from said inverter and an output signal from said latching means; and a PMOS transistor having a source coupled to the power supply voltage source, a drain coupled to the complementary global I/O line, and a gate receiving an output signal from said NAND gate.

* * * * *